United States Patent [19]
Zucker et al.
[11] 3,805,189
[45] Apr. 16, 1974

[54] OSCILLATORS USING SURFACE ACOUSTIC WAVE DELAY LINE

[75] Inventors: Joseph Zucker, Peabody; John Matarese, New City, both of N.Y.

[73] Assignee: GTE Laboratories Incorporated, Waltham, Mass.

[22] Filed: Nov. 27, 1972

[21] Appl. No.: 309,836

[52] U.S. Cl. ..... 331/107 A, 331/108 B, 331/117 R, 331/135
[51] Int. Cl. ..... H03b 5/12
[58] Field of Search ..... 331/107 A, 135, 117 R, 331/136, 108 R, 108 B; 333/30, 72

[56] References Cited
UNITED STATES PATENTS

| | | | |
|---|---|---|---|
| 3,582,540 | 6/1971 | Adler et al. | 331/107 A X |
| 3,568,102 | 3/1971 | Tseng | 331/107 A X |
| 3,446,975 | 5/1969 | Adler et al. | 333/72 X |

*Primary Examiner*—Herman Karl Saalbach
*Assistant Examiner*—Siegfried H. Grimm
*Attorney, Agent, or Firm*—Irving M. Kriegsman; Robert A. Walsh

[57] ABSTRACT

A stable sine wave oscillator is disclosed in which the frequency is controlled by a surface wave acoustic delay line in the oscillator feedback circuit. The oscillator is capable of operating at discrete frequencies within the wide bandpass of the acoustic surface wave delay line for which an integral number of wave lengths exist on the line.

9 Claims, 8 Drawing Figures

OSCILLATORS USING SURFACE ACOUSTIC WAVE DELAY LINE

BACKGROUND OF THE INVENTION

The invention relates to a stable sine wave oscillator and in particular to oscillators using acoustic surface wave devices. The specific frequency of operation depends upon the simultaneous existence of gain in excess of unity and phase shift equal to an integral number times 2 $\pi$ radians ($2n\ \pi$ where $n = 1,2$ etc) around the feedback loop. These conditions can be met in either of two ways. First, the gain of the amplifier can be adjusted to overcome the loss in the delay line only at a frequency which is equal to or close to the frequency of maximum transmission of the delay line and for which an integral number of wavelengths exists on the line. Second, the resonant frequency of a tuned circuit in the feedback loop and the gain of the amplifier can be adjusted so as to restrict the loop gain to unity or greater at some other frequency within the passband of the delay line for which an integral number of wavelengths exist on the line.

The frequency of operation can also be varied by varying the velocity of the surface waves, for example by changing the ambient temperature.

The general method of controlling the frequency of a sine wave oscillator is to control the reactance of the oscillator tuned circuit. In one type of oscillator, a quadrature current is caused to flow through an inductance-capacitance (LC) circuit under control of a variable gain amplifier. By electronically varying the amplifier gain, the amount of quadrature current is varied and the frequency of oscillation changes accordingly. This type of oscillator is gain sensitive in that the frequency control relies on the stability and linearity of the amplifier characteristics. A second type of variable frequency oscillator employs a variable reactance device, such as a reverse-bias diode or a variable inductor, in the oscillator tuned circuit. This type of circuit is typically a narrow band oscillator due to lack of commercially available wide band variable reactances. In addition, an analog signal is used to vary the reactance and, therefore, the circuit is amplitude and gain sensitive. The amplitude and gain sensitivity of both the aforementioned variable frequency oscillators tend to result in frequency variation during operation.

SUMMARY OF THE INVENTION

The present invention is directed to a stable sine wave oscillator in which the frequency is controlled by an acoustic surface wave delay line. The specific frequency of operation may either be at or close to the frequency of maximum transmission of the acoustic surface wave device or may be adjusted within the bandpass of the acoustic surface wave device by an external high Q tuned circuit.

In either case, some integral number of surface acoustic wavelengths must exist on the line at the frequency of operation.

When the circuit resonance is in agreement with the frequency required to establish an integral number of acoustic wavelengths on the line, stable oscillation is produced. The separation between adjacent oscillation frequencies is determined by the line length (number of wavelengths on the line) and occur when the wavelength difference times the number of wavelengths corresponds to one full cycle. Since the phase shift of acoustic surface wave devices is independent of the gain of the active devices employed therein, oscillators constructed in accordance with the present invention possess good frequency stability.

The present oscillator includes a series tuned circuit. In the oscillator the surface wave delay line is connected between the output of an amplifier which has two stages, the amplifier and the delay line is interconnected to provide closed loop operation. For oscillation to occur, the requirements that the phase shift be equal to an integral number of $2\pi$ radians and that overall loop gain be in excess of unity must be realized. Accordingly, by way of example, one stage of the amplifier may be connected in a common collector mode while the second stage of the amplifier is connected in a common base mode of operation. Zero overall phase shift results from the non-inverting, wide gain characteristic of these stages. Voltage gain is provided by the common base stage of the amplifier to overcome the signal attenuation of the surface acoustic wave device. In this mode of operation, the frequency of oscillation is determined approximately by the resonant frequency (the frequency of acoustic synchronism or maximum energy transfer). Stable sinusoidal oscillation can therefore be achieved near a synchronous frequency of the surface acoustic wave device.

Another embodiment, a multi-step frequency oscillator, may be obtained if the collector load of the common base amplifier stage is replaced with a high Q tuned (LC) circuit resonant at a frequency within the wider pass band of the surface acoustic wave delay line. Tuning the LC tank will result in stable oscillation when the circuit resonance is in agreement with the frequency required to establish an integral number of surface acoustic wavelengths on the line. Accordingly, it is an object of our invention to provide a stable sinusoidal oscillator. Another object of the present invention is to provide a stable oscillator which effectively operates at various discrete frequencies over a frequency band.

Another object is to provide an oscillator with matching impedance to achieve maximum signal transmission.

Still another object is to utilize amplitude stabilization to insure a low distortion level.

BRIEF DESCRIPTION OF THE DRAWINGS

The features of the present invention which are believed to be novel are set forth with particularity in the appended claims. The above objects of and a brief introduction to the present invention will be more fully understood and further objects and advantages will become apparent from a study of the following description in connection with the drawings. In the several figures of which like reference numerals identify like elements

DESCRIPTION OF THE PREFERRED EMBODIMENT

The specification now proceeds to a description of a preferred form of the apparatus for producing stable sinusoidal electrical signals by using a surface acoustic wave delay line in accordance with the invention.

Figure 1:
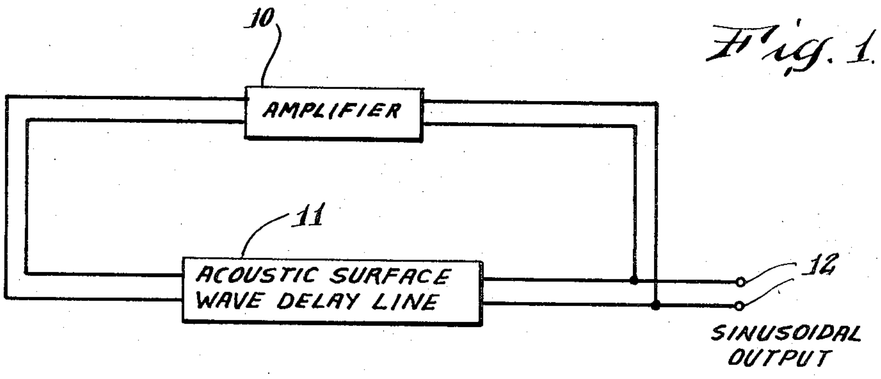
FIG. 1 is a block diagram for an oscillator in accordance with the present invention.

Attention is directed to FIG. 1 wherein the basic oscillator in accordance with the invention is illustrated in diagrammatic form. The amplifier 10 produces an output signal which is applied to the input of the surface acoustic wave delay line 11. Initially the output signal encompasses a broad frequency spectrum, e.e., noise. The operation of the acoustic wave delay line is described more fully hereinafter. The output signal of the acoustic wave delay line 11 is then applied to the input of amplifier 10 wherein the signal is amplified and reapplied to the input of delay line 11. Signals at frequencies for which both the loop gain is greater than unity and the phase shift of the delay line 11 is an integral number of 2 $\pi$ radians will increase with each traverse of the loop. It is at these frequencies that the loop can sustain stable oscillations.

The above described operation is typical of a closed loop regenerative feedback system. The amplifier 10 used in such a system should be capable of producing an overall loop gain greater than unity in the region of operation to overcome the signal attenuation in the loop, which is caused primarily due to the losses of the surface acoustic wave delay line. Further, the amplifier 10 should be a linear non-inverting type in order to avoid any phase shift from the input of the amplifier to the input of the delay line. Therefore, the amplifier used in actual operation may be any single or multiple stage device which is capable of producing loop gain greater than unity with zero phase shift. Such an amplifier may be constructed of a variety of combinations of either solid state or vacuum tube components, an example of a typical amplifier is described hereinafter.

Figure 2:
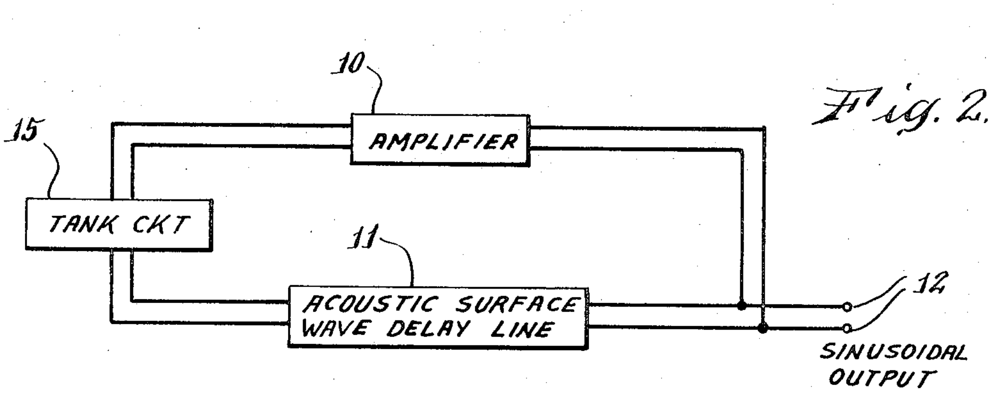
FIG. 2 is a block diagram of a modification of the oscillator of FIG. 1.

A modification of the above mentioned basic oscillator is illustrated in FIG. 2, wherein a tunable tank circuit 15 has been electrically coupled between the output of amplifier 10 and the delay line 11. The tank circuit 15 may be of any conventional construction such as an inductor-capacitor (LC) type. The inclusion of the tank circuit allows greater flexibility and control over the frequency output of the oscillator. The tank circuit preferably has a high Q which may be tuned within the wide band pass of the delay line. Due to the properties of the delay line (discussed hereinafter) the oscillator is capable of operating over a number of discrete frequencies.

Figure 3:
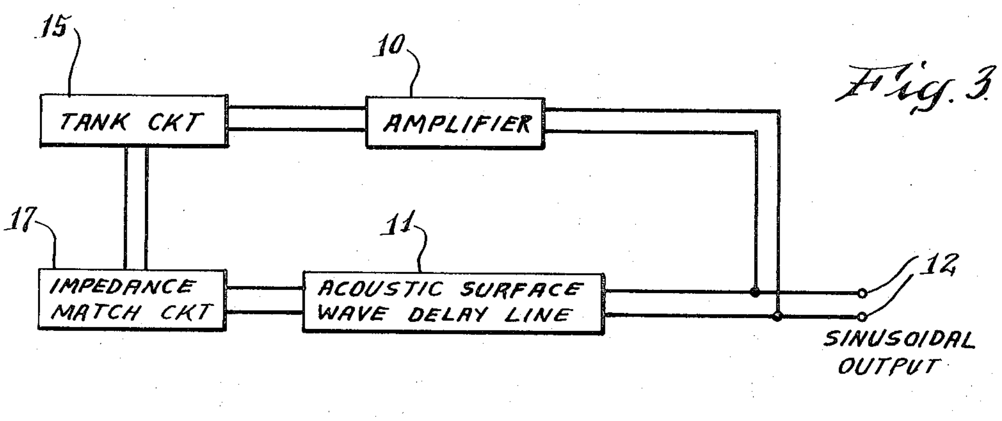
FIG. 3 is a block diagram of another modification of the oscillator of FIG. 1.

A further modification of the basic oscillator is illustrated in FIG. 3, wherein an impedance matching circuit 17 is electrically coupled between the tank circuit 15 and the delay line 11. The impedance matching circuit comprises basically inductive elements to compensate and be in resonance with the capacitive nature of the surface acoustic wave delay line. Such a matching circuit produces the maximum signal transmission from and through the delay line.

Figure 4:
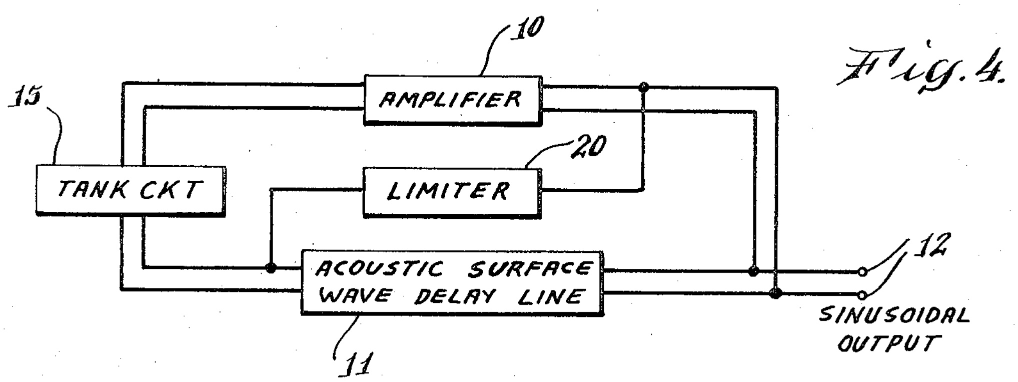
FIG. 4 is a block diagram of another modification of the oscillator of FIG. 1.

An even further modification of the basic oscillator is illustrated in FIG. 4, wherein a limiter circuit 20 is electrically coupled between the input of amplifier 10 and delay line 11. The limiter circuit 20 comprises a DC bias control circuit and a diode. Such a limiter circuit produces amplitude stabilization to insure a low distortion level at the output of the oscillator.

Figure 5:
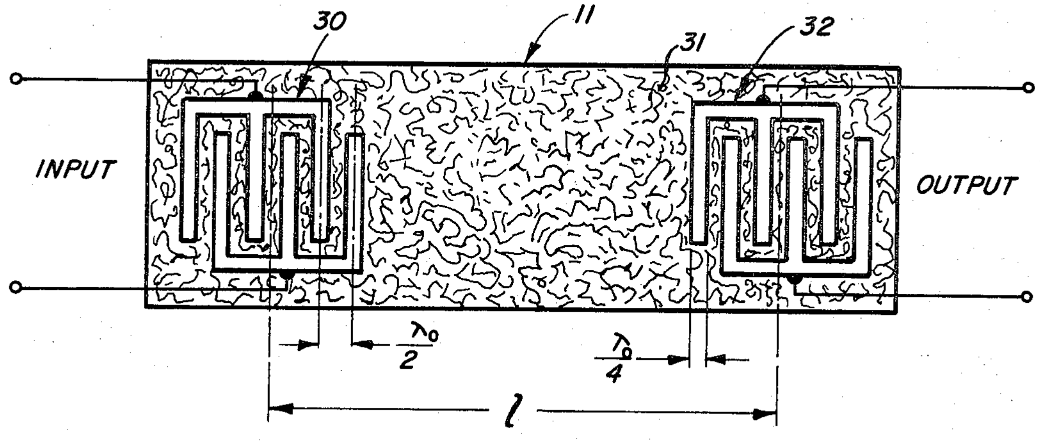
FIG. 5 is a plan view of an acoustic surface wave delay line used in the device of FIG. 1.

The description of the invention now proceeds to a discussion of the acoustic surface wave delay line 11 hereinbefore mentioned and illustrated in the FIG. 5. The input signal is connected across an input transducer system 30 mechanically coupled to one major surface of a body of piezoelectric material in the form of a substrate 31 which is capable of propagating acoustic surface waves. An output or second portion of the same surface of substrate 31, is, in turn, mechanically coupled to an output transducing system 32. The output signal is established across the output transducing system 32. Transducers 30 and 32, in the simplest arrangement, are each constructed of a pair of comb-type electrode arrays. The strips of conductive elements of one comb are interleaved with the strips of the other in each pair. The electrodes are of a material such as gold or aluminum, which may be vacuum deposited on a smoothly lapped and polished surface of the piezoelectric body. The piezoelectric material, such as PZT, quartz, lithium niobate, lithium tantalate, ZnO, ZnS, or CdS; is propagative of acoustic waves. The distance between the centers of the two consecutive strips in each array is one half the acoustic wave length of a signal for which it is desired to achieve maximum response in that array.

Direct piezoelectric surface-wave transduction is accomplished by the spatially periodic interdigital electrodes or teeth of transducer 30. A periodic electric field is produced when a signal across the input is fed to the electrodes and, through piezoelectric coupling, the electric signal is transduced to a travelling acoustic surface wave in substrate 31. This occurs when the strain components produced by the electric field in the piezoelectric substrate are substantially matched to the strain components associated with the surface-wave mode. The surface waves resulting in substrate 31 in response to the energization of transducer 30 by the input signal, are transmitted along the substrate to output transducer 32 where they are converted to respective electrical output signals that are superimposed across the output. In a typical delay line embodiment, utilizing PZT-6A as the piezoelectric substrate, the strips of input transducer 30 are aproximately 2 mils wide and are separated by about 2 mils. The spacing between input transducer 30 and output transducer 32 is on the order of 0.55 inches and the width of the wave front launched by the input transducer is approximately 150 mils. The structure of transducer 30 and output transducer 32, together with the effect of substrate 31 can be roughly compared to a cascade of two tuned circuits. The resonant frequency ($f_o$), is determined, at least to the first order, by the spacing of the strips and the velocity of wave propagation. The resonant frequency of such a resonator is determined analytically to be: $f_o = v/\lambda_o$, where $v$ is the surface acoustic wave velocity of the piezoelectric material which in the case of PZT-6A is found to be about 0.20 × $10^6$ centimeters per second, and the wavelength $\lambda_o$ corresponds to the period of the interdigital elements. For the particular delay line used, the acoustic synchronism or maximum energy transfer frequency was determined to be about 10.0 MHZ.

Figure 6:
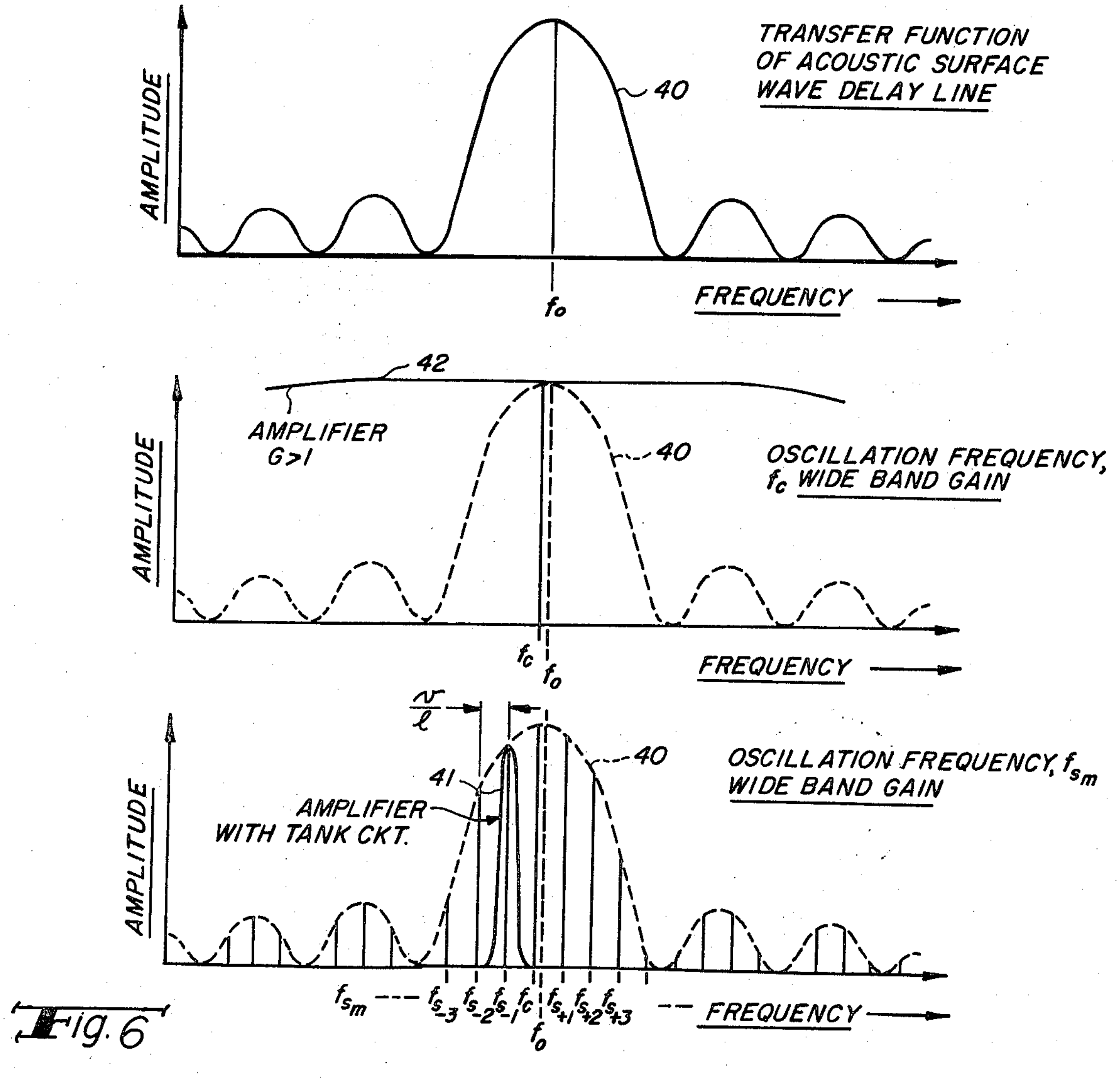
FIG. 6 is a graphical diagram of the transfer function of an acoustic surface wave delay line and amplifier.

The frequency response or transfer function presented by the delay line is shown in FIG. 6. That response exhibits a major lobe 40 centered about a frequency $f_o$ and symmetrically spaced from much smaller lobes with alternating succession of nulls or minimums. In terms of frequency, the minor lobes are spaced outwardly in both directions from the major lobe at the center frequency $f_o$. To achieve this response, the spacings between the midpoints of successive strips of the electrode array of transducer 30 are equal to one half an acoustic surface wavelength at that center frequency $f_o$ and the strips are of equal length. The frequency selectivity may be sharpened, that is, the null points may be moved closer to $f_o$, by increasing the number of individual electrodes in transducer 30. Conversely, a decrease in the total number of individual transducer electrodes results in a broadening of the major response lobe 40 and a corresponding movement of its null points further away from frequency $f_o$.

A further feature of the surface acoustic wave delay line relates to the delay line's capability to operate at several discrete frequencies within the bandpass of the delay line. These discrete operating frequencies are those for which there is an integral number of wavelengths, and consequently, a phase difference of an integral number of $2\pi$ radians across the delay path between input and output transducers. The frequency of oscillation changes with variation in the acoustic velocity of a delay line of fixed length so that some integral number of wavelengths exist on the delay line. For example, an oscillator as shown in FIG. 1 could be constructed with an amplifier having a loop gain slightly in excess of unity, characterized by a transfer function 42 and an acoustic surface wave delay line characterized by transfer function 40, shown in FIG. 6. The output of such as oscillator would operate at a frequency $f_o$, determined by an integral number of wavelengths appearing on the line near the maximum transmission of the delay line.

Similarly, a change in frequency of oscillation results if external means restrict the loop gain to a frequency for which some other integral number of wavelengths occur. For example, an oscillator as shown in FIG. 2 could be constructed with an amplifier and tank circuit having a loop gain in excess of unity, characterized by a transfer function 41 and an acoustic surface wave delay line characterized by a transfer function 40, shown in FIG. 6. The tank circuit being tunable throughout the bandpass of the resonator, will result in stable oscillations when the circuit resonance is in argeement with any discrete frequency ($f_{sm}$) required to establish an integral number of acoustic surface wavelengths on the line. The frequency separation of these steps is determined by the line length $l$, which controls the number of wavelengths on the line, $n$ and the velocity $v$ of the surface acoustic waves. These steps occur when the difference in the number of wavelengths on the line is an integer. Adjacent operating frequencies will differ by one in the number of wavelengths in the delay path. If $l$ is the length of the delay path, then the number of wavelengths in the path at a frequency $f_s$ is $n_s = l/\lambda_s$ where the wavelength $\lambda_s$ is related to the frequency by $f_s$ is $n_s = l/\lambda_s$ where the wavelength $\lambda_s$ is related to the frequency by $f_s\lambda_s = v$ where $v$ is the velocity of the surface acoustic wave. For adjacent frequencies $f_s$ and $f_{(s\pm1)}$, $|n_s - n_{(s\pm1)}| = 1$ so that $|l/\lambda_s - l\lambda_{(s\pm1)}| = 1$ or $$|f_s\, l/v - f_{(s\pm1)}\, l/v| = 1$$

so that $$|f_s - f_{(s\pm1)}| = v/l.$$

The quantity $v/l$ is then the separation between adjacent operating frequencies.

The period of the transducer is $\lambda_o$ so the synchronous frequency is $f_o = v/\lambda_o$ and the number of wavelengths on the delay path at $f_o$ is $l/\lambda_o$ which is not necessarily an integer. Let $n_c$ be the closest integer to $l/\lambda_o$ so that $\lambda_{n_c} = l/n_c$ is the wavelength of the operating frequency $f_c = v/\lambda_{n_c}$ closest to the synchronous frequency. The possible operating frequencies are then $$f_{sm} = f_c \pm mv/_l$$

where $m$ is an integer.

This may be written $$f_{sm} = f_c\ (1 \pm m/n_c)$$

by noting that $f_c = v/\lambda_{n_C} = vn_{c/l}$ so that $mv/_l = mf_c/n_c$. These frequency relationships are shown in FIG. 6.

The tank circuit may be tuned midway between two adjacent frequency steps such that the overall phase delay is 180°. Oscillation may either terminate or occur simultaneously at the upper and lower frequency, dependent upon the circuit selectivity and available gain.

For the particular surface acoustic wave delay line which was built and tested, the line length, $l$, was 0.55 inch, the transducer period, $\lambda_o$, was 0.008 inch and the observed frequencies of oscillation were $f_{sm}$ = 9.746, 9.879, 10.028, 10.177, 10.320, 10.470, 10.615, and 10.762 MHz. The differences $\Delta f$ between adjacent frequencies are then 133, 149, 149, 143, 150, 145, and 147 KHz. The average of $\Delta f$ is then 145.1 KHz. Equating the average of $\Delta f$ to $v/l$ we get $v = 2.03 \times 10^5$ cm/sec. The closest integer to $l/\lambda_o$ is $n_c = 69$, so that $\lambda_{n_c} = l/n_c = 0.55/69 = 0.00797$ inch and the operating frequency closest to the synchronous frequency should then be $f_c = v/\lambda_{n_c} = 10.027$ MHz, in good agreement with the observed frequency of 10.028 MHz.

Figure 7:
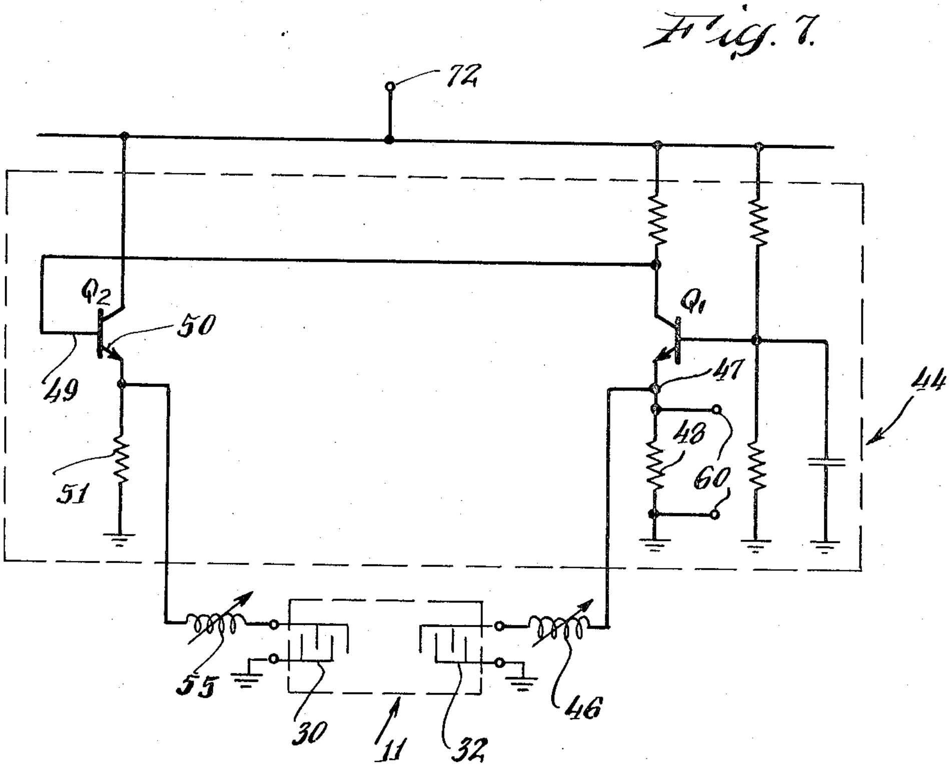
FIG. 7 is a plan schematic view of an oscillator circuit.
Figure 8:
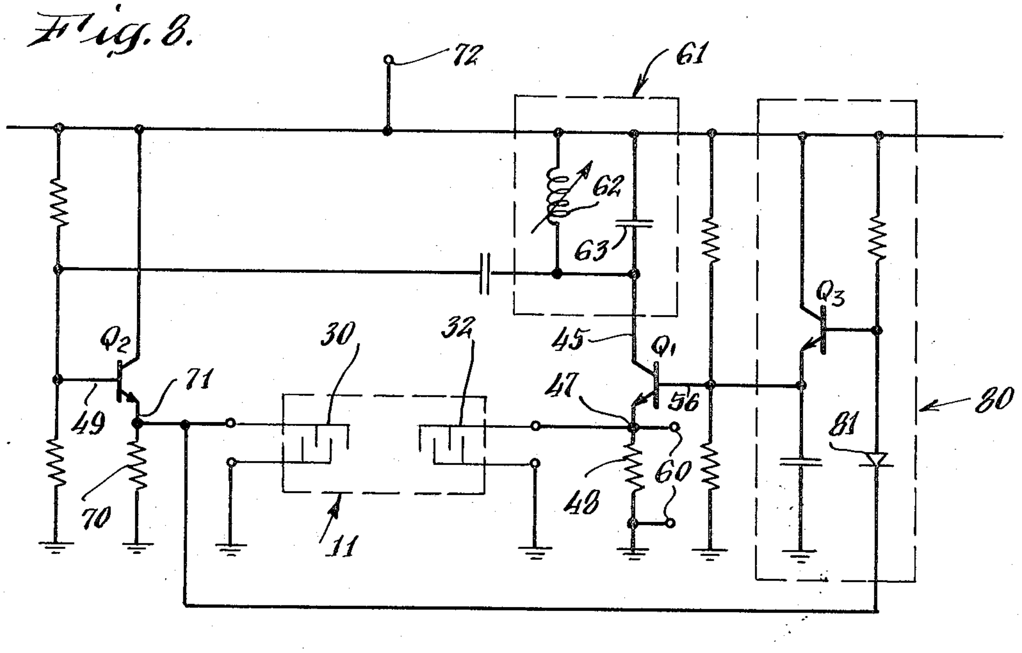
FIG. 8 is a plan schematic view of a modification of the circuit of FIG. 7.

Actual circuits built and tested are schematically illustrated in FIGS. 7 & 8. Attention is now directed to FIG. 7 wherein a circuit is illustrated similar to that previously described and illustrated in block diagrammatic form in FIG. 1. Referring to FIG. 7, surface acoustic wave delay line 11 which is identical to the type hereinbefore discussed is electrically coupled by the terminals on output transducer 32 of delay line 11 to an impedance matching inductor 46 which is in turn coupled to the input of an amplifier indentified generally within dotted outline 44. The amplifier comprises two conventional stages: a common base involving transistor $Q_1$ and an emitter follower stage involving transistor $Q_2$. The oscillatory output of inductor 46 is coupled to the emitter 47 of transistor $Q_1$ across resistor 48. The signal is amplified by transistor $Q_1$ and the oscillating signal is presented to the base connection 49 of transistor $Q_2$. The output signal of transistor $Q_2$ is established at the emitter junction 50 and across resistor 51. The signal is transmitted to the input transducer 30 of delay line 11 through an impedance matching inductor 55. The signal propagates across the delay line as previously described and appears at the output transducer 32. The oscillator is a series closed loop regenerative feedback type circuit which is well known in the art. In the steady state operation a stable sinusoidal electrical output may be withdrawn across resistor 48 at output terminals 60.

The above mentioned oscillator was constructed with N-P-N transistors 2N2218. The non-inverting wide band characteristics of the amplifier used exhibited a zero overall phase shift. Further, the voltage gain provided by the common base stage is sufficient to overcome the attenuation of the surface wave delay line and therefore provided an overall loop gain greater than unity. The oscillator operated near the resonant center frequency of the acoustic surface wave delay line of about 10 MHz measured at the output terminals.

Attention is now directed to FIG. 8 wherein a circuit is illustrated similar to that previously described and illustrated in a block diagrammatic form in FIG. 4. Referring to FIG. 8, a surface acoustic wave delay line 11 is electrically coupled by the output transducer 32 of the delay line to emitter 47 of transistor $Q_1$ and to resistor 48. The transistor $Q_1$ is connected in a common base mode amplifier configuration. The output oscillatory voltage signal is established at the collector 45 of $Q_1$ and coupled to an LC tank circuit identified generally within dotted outline 61. The tank circuit comprises a variable inductance 62 and capacitor 63. The LC tank circuit has a high Q and may be tuned within the wider pass band of the surface acoustic wave delay line. The output signal of the tank circuit is established at the base 49 of transistor $Q_2$. The transistor $Q_2$ is connected in an emitter follower configuration and establishes an output signal across resistor 70 and input transducer 30 at the emitter junction 71. The signal is carried across the delay line 11 as previously described and presented at the output transducer 32. The oscillator, as is now apparent, is seen to be arranged in a series, closed-loop regenerative feedback type circuit.

A limiter circuit identified generally within dotted outline 80 in FIG. 8, comprises a transistor $Q_3$ and diode 81. The limiter circuit is coupled between the base 56 of $Q_1$ and the input transducer 30 of delay line 11. The limiter circuit with diode 81 and DC bias control transistor $Q_3$ conducts when the negative peak of oscillation at the input transducer 30 exceeds a specified DC level. A negative DC control voltage is produced under these conditions to lower the gain of the common base stage amplifier $Q_1$ and maintain a constant signal level. For a 6 volt D. C. power supply (not shown) coupled to terminal 72, an oscillation level of approximately 0.5 volt rms is maintained at the input transducer 30 at any frequency step within the delay line pass band.

By tuning the tank circuit 61 within the passband of the delay line 11 various sinusoidal oscillating frequencies have been established across output terminals 60. As was stated earlier, stable frequency steps have been observed at 9.746, 9.879, 10.028, 10.177, 10.320, 10.470, 10.615, and 10.762 MHz. Tuning the LC tank therefore results in stable oscillation when the circuit resonance is in agreement with the frequency required to establish an integral number of acoustic wave lengths on the line.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

What is claimed is:

1. A stable sinusoidal oscillator comprising:

a surface acoustic wave delay line having a plurality of discrete operating frequencies which includes:

an acoustic surface wave propagating medium;

an input transducer coupled to a first portion of said medium and responsive to an applied signal for launching an acoustic surface wave in said medium;

an output transducer coupled to a second portion of said medium and responsive to acoustic surface waves launched therein for deriving an output signal, both input and output transducers include a pair of interleaved combs of electrodes;

an amplifier means electrically coupled between said input and output transducer for applying an amplified signal to said input transducer in phase with said output signal, said amplifier providing an overall loop gain of greater than unity; and a tuned circuit electrically coupled to said amplifier for selecting one of the discrete frequencies of said delay line and thereby determining the output signal frequency.

2. The oscillator of claim 1 in which the tuned circuit comprises parallel capacitance and inductance elements.

3. The oscillator of claim 1 wherein said amplifier comprises a two stage device, the first stage being a high gain common base mode transistor amplifier and the second stage being an emitter follower mode transistor amplifier.

4. The oscillator of claim 1 which additionally includes an impedance matching circuit electrically coupled to said delay line for maximum energy transfer.

5. The oscillator of claim 4 in which the matching circuit comprises inductance elements to match the capacitive elements of said delay line.

6. The oscillator of claim 4 which additionally includes a limiter circuit electrically coupled between said output transducer and said input transducer for providing amplitude stabilization.

7. The oscillator of claim 6 in which the limiter circuit comprises a bias control element and a diode effectively lowering the gain of said amplifier.

8. A stable sinusoidal oscillator having an output comprising:

a. a surface acoustic wave delay line having input and output terminals, said delay line having a resonant center frequency of operation near the output frequency of the oscillator; and b. a non-inverting two stage amplifier electrically coupled between the input and output terminals of said delay line providing a series regenerative feedback circuit, the first stage of said amplifier comprising a common base mode circuit, and the second stage of said amplifier comprising an emitter follower circuit.

9. A stable sinusoidal oscillator having an output comprising:

a. a surface acoustic wave delay line having input and output terminals, said delay line having a plurality of discrete operating frequencies;

b. a non-inverting amplifier electrically coupled between the input and output terminal of said delay line providing a series regenerative feedback loop, said amplifier having a loop gain of greater than unity;

c. a tunable resonant circuit electrically coupled to said amplifier for selecting the output oscillator frequency from the operating frequencies of said delay line; and d. a limiter circuit electrically coupled to said amplifier for providing amplitude stabilization.

* * * * *